(12) United States Patent  
Ogura (10) Patent No.: US 6,349,060 B1
(45) Date of Patent: Feb. 19, 2002

(54) NON-VOLATILE SEMICONDUCTOR MEMORY DEVICE HAVING A STABLE READ MARGIN

(75) Inventor: Taku Ogura, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/737,736

(22) Filed: Dec. 18, 2000

(30) Foreign Application Priority Data

Jul. 4, 2000 (JP) ........................................ 2000-202081

(51) Int. Cl.[7] .............................................. G11C 16/06
(52) U.S. Cl. .......................... 365/185.21; 365/185.22; 365/189.06; 365/189.09
(58) Field of Search ....................... 365/185.21, 185.22, 365/185.29, 185.24, 185.33, 189.09, 189.02, 189.06; 327/538; 330/252

(56) References Cited

U.S. PATENT DOCUMENTS

| | | | | |
|---|---|---|---|---|
| 5,642,310 A | * | 6/1997 | Song ..................... | 365/185.29 |
| 5,736,899 A | * | 4/1998 | Bowers et al. .............. | 330/252 |
| 6,037,832 A | * | 3/2000 | Kaminishi .................. | 327/538 |
| 6,201,742 B1 | * | 3/2001 | Hirai et al. ............ | 365/189.09 |

* cited by examiner

Primary Examiner—David Nelms
Assistant Examiner—David Lam
(74) Attorney, Agent, or Firm—McDermott, Will & Emery (57) ABSTRACT

A flash memory having a sense amplifier is provided with a constant-current source having the positive temperature characteristic and a constant-current source having the negative temperature characteristic. The sense amplifier combines a current having the positive temperature characteristic and a current having the negative temperature characteristic to generate a verifying sense amplifier load current having no temperature characteristic, and combines a current having the positive temperature characteristic and a current having a power-supply voltage dependency to generate a normal-read sense amplifier load current. Thus, the sense amplifier has a sufficient read margin and is capable of performing an accurate verify operation.

8 Claims, 13 Drawing Sheets

NON-VOLATILE SEMICONDUCTOR MEMORY DEVICE HAVING A STABLE READ MARGIN

BACKGROUND OF THE INVENTION

1. Field of the Invention

The present invention relates to a non-volatile semiconductor memory device, and more specifically, to an improvement of a sense amplifier of a flash memory.

2. Description of the Background Art

In a flash memory, the threshold voltage of a memory cell is made low or high by the program operation or an erase operation so as to distinguish between data "0" and data "1." In a DINOR (DIvided NOR) type flash memory under development, the state of low threshold voltage is defined as a programmed state "0," and the state of high threshold voltage is defined as an erased state "1." To program data, high voltage pulses need to be applied repeatedly to a memory cell until the threshold voltage of the memory cell becomes lower than a prescribed voltage (program verify voltage PV). In addition, to erase data, high voltage pulses need to be applied repeatedly to the memory cell until the threshold voltage of the memory cell becomes higher than a prescribed voltage (erase verify voltage EV). Thus, when programming and erasing data, a verify operation must be performed for determining whether the threshold voltage of the memory cell has reached the prescribed voltage or not. The verify operation is performed using a sense amplifier for performing a normal read ("read" for short) operation in a similar manner.

Figure 10:
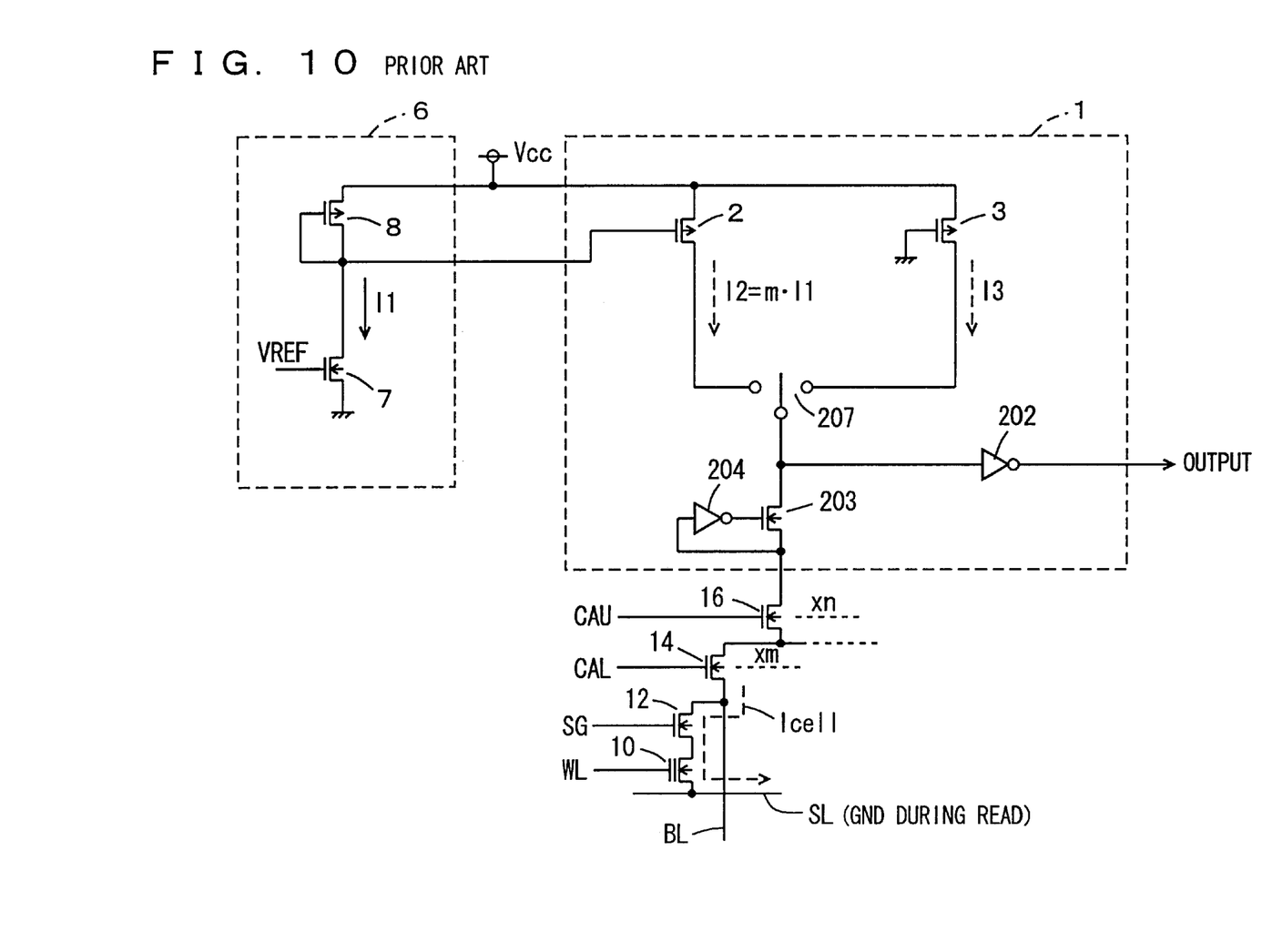
FIG. 10 is a circuit diagram representing the arrangement of a conventional sense amplifier in a flash memory.

FIG. 10 is a circuit diagram representing an arrangement of a conventional sense amplifier. As shown in FIG. 10, a sense amplifier 1 includes a verifying P-channel MOS transistor 2, a normal-read P-channel MOS transistor 3, an inverter 202, an N-channel MOS transistor 203, an inverter 204, and a switch 207. Switch 207 selects transistor 2 during the verify operation and selects transistor 3 during the normal read operation. Inverter 202 compares a memory cell current Icell that flows through a non-volatile memory cell 10 with a sense amplifier load current I2 or a sense amplifier load current I3. As a result, sense amplifier 1 can determine the state of memory cell 10.

During the verify operation and the normal read operation, the voltage of a source line SL attains a ground voltage, and the voltage of a word line WL attains a power-supply voltage Vcc. Thus, memory cell current Icell flows to memory cell 10.

During the verify operation, transistor 2 supplies sense amplifier load current I2 which is m times a constant current I1. Constant current I1 is generated by a constant-current source 6. Constant-current source 6 includes an N-channel MOS transistor 7 and a P-channel MOS transistor 8. Transistor 7 has a constant reference voltage VREF applied at a gate so that it can supply constant current I1 that is independent of power-supply voltage Vcc. Transistor 2 and transistor 8 together form a current mirror circuit. The size of transistor 2 is m (mirror coefficient) times that of transistor 8. Thus, transistor 2 is capable of supplying sense amplifier load current I2 which is m times constant current I1.

On the other hand, during the normal read operation, transistor 3 supplies sense amplifier load current I3. Transistor 3 is independent from constant-current source 6, and has a ground voltage applied to a gate so that transistor 3 can supply sense amplifier load current I3 that is dependent on power-supply voltage Vcc.

Figure 11:
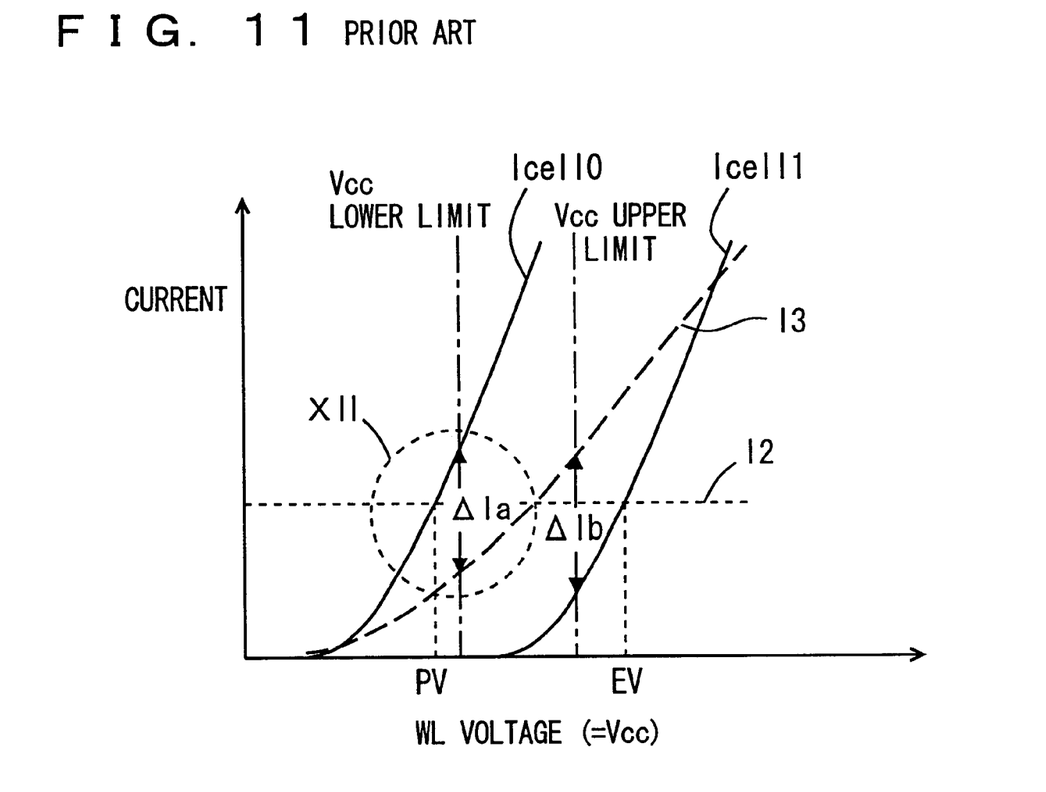
FIG. 11 is a graph showing the relations of a voltage of a word line with a sense amplifier load current and a memory cell current in the flash memory shown in FIG. 10.

FIG. 11 is a graph showing the relations of the voltage of the word line to the sense amplifier load current and the memory cell current.

During a program verify operation for verifying whether memory cell 10 has been programmed or not, a program verify voltage PV is applied to a word line WL, and program pulses are continually applied to memory cell 10 until a memory cell current Icell0 that is to flow through memory cell 10 when data is "0" becomes greater than sense amplifier load current I2.

On the other hand, during an erase verify operation for verifying whether memory cell 10 has been erased or not, an erase verify voltage EV is applied to word line VL, and erase pulses are continually applied to memory cell 10 until a memory cell current Icell1 that is to flow through memory cell 10 when data is "1" becomes smaller than sense amplifier load current I2.

From memory cell 10 in the programmed state (data "0") or in the erased state (data "1") thus formed, data "0" or data "1" is read using transistor 3 of sense amplifier 1.

A normal-read sense amplifier load current I3 depends on power-supply voltage Vcc, and becomes greater as power-supply voltage Vcc becomes higher as shown in FIG. 11. Power-supply voltage Vcc fluctuates between a Vcc upper limit and a Vcc lower limit shown in FIG. 11.

When memory cell 10 is in the programmed state, or when data "0" is stored in memory cell 10, memory cell current Icell0 is greater than normal-read sense amplifier load current I3. As a result, sense amplifier 1 outputs an H (logic high) level signal.

On the other hand, when memory cell 10 is in the erased state, or when data "1" is stored in memory cell 10, memory cell current Icell1 becomes smaller than normal-read sense amplifier load current I3. As a result, sense amplifier 1 outputs an L (logic low) level signal.

FIG. 11 shows a read margin ΔIa at the Vcc lower limit and a read margin ΔIb at the Vcc upper limit. The smaller the fluctuation range of power-supply voltage Vcc, the greater read margins ΔIa and ΔIb become, whereby a stable read operation becomes possible.

The conventional sense amplifier, however, has such problems as described below.

Figure 12:
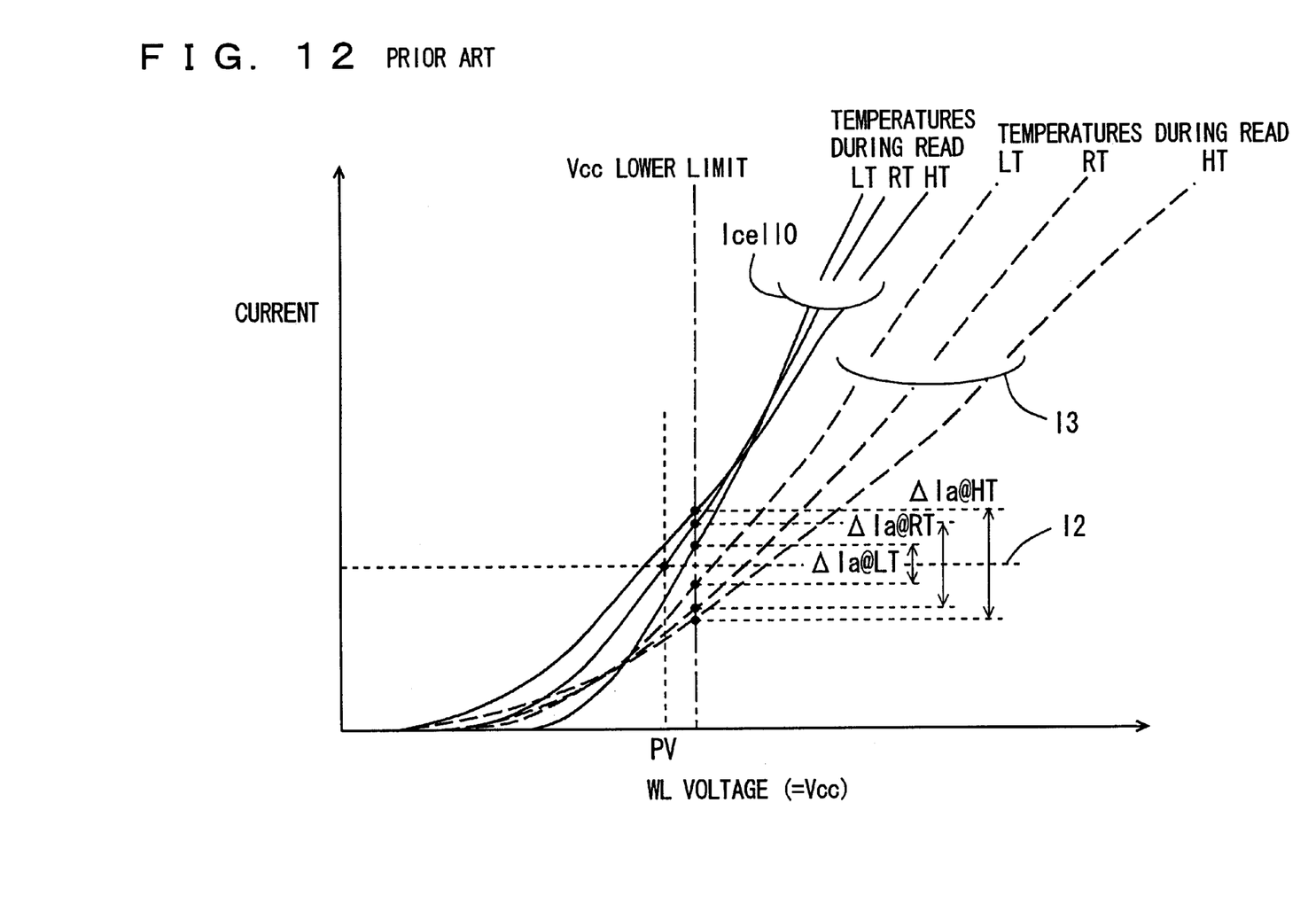
FIG. 12 is a graph of vicinity XII of the Vcc lower limit in FIG. 11 shown enlarged.

One problem is that read margin ΔIa at the Vcc lower limit becomes smaller as the temperature gets lower. FIG. 12 is a graph of a vicinity XII of the Vcc lower limit in FIG. 11 shown enlarged. In FIG. 12, memory cell currents Icell0 and normal-read sense amplifier load currents I3 at a low temperature LT, a room temperature RT, and a high temperature HT (LT<RT<HT) are respectively shown. As shown in FIG. 12, memory cell current Icell0 at the Vcc lower limit becomes smaller as the temperature gets lower. On the contrary, normal-read sense amplifier load current I3 at the Vcc lower limit becomes greater as the temperature gets lower. Thus, read margin ΔIa at the Vcc lower limit becomes smaller as the temperature gets lower. In FIG. 12, the read margin at room temperature is denoted by ΔIa@RT, the read margin at a high temperature is denoted by ΔIa@HT, and the read margin at a low temperature is denoted by ΔIa@LT.

Figure 13:
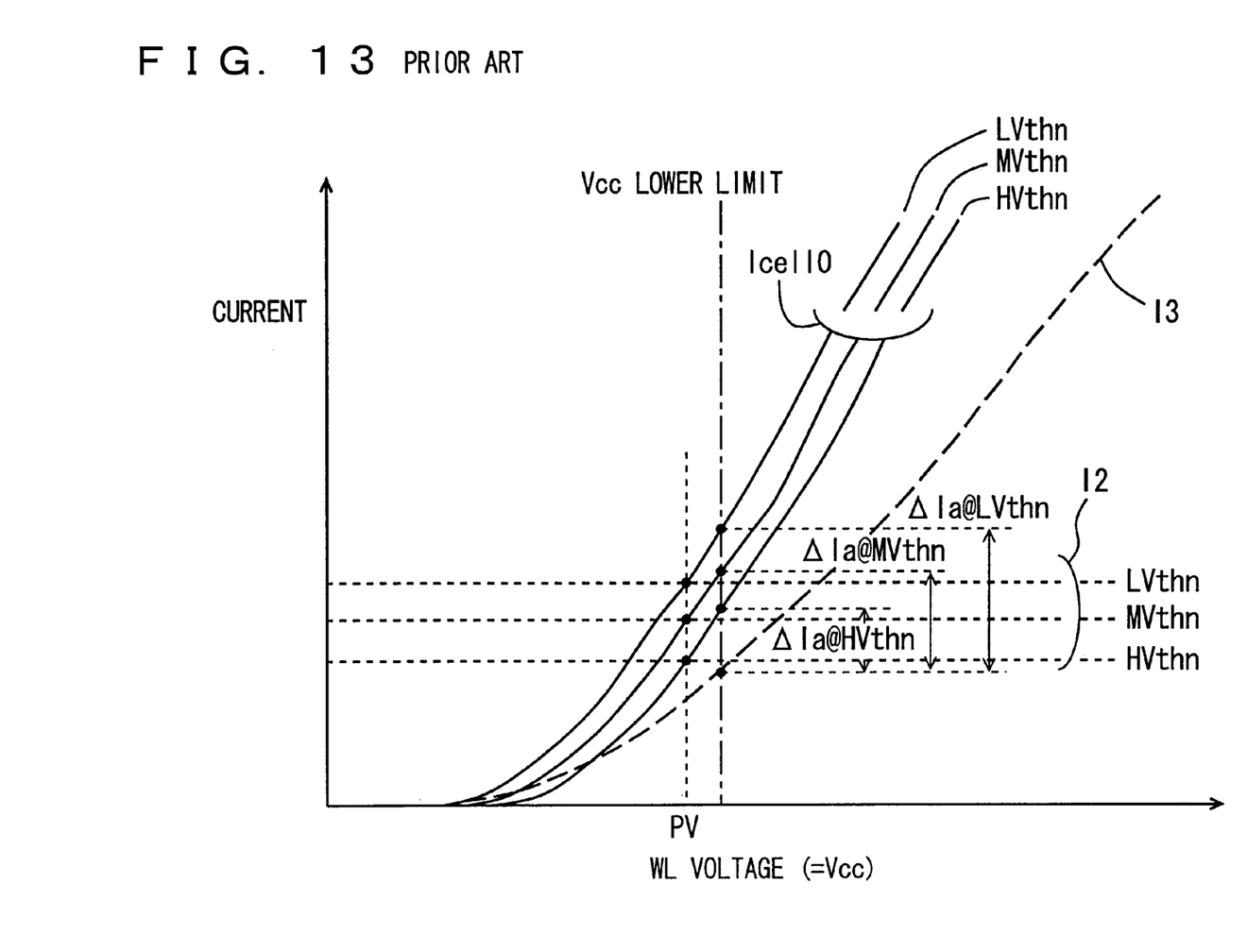
FIG. 13 is a graph showing the threshold voltage dependency of a memory cell current with vicinity XII of the Vcc lower limit in FIG. 11 enlarged.

Another problem is that read margin ΔIa at the Vcc lower limit varies according to the variation of the process. As shown in FIG. 10, N-channel MOS transistor 7 generates constant current I1 according to reference voltage VREF, and this current I1 becomes smaller as a threshold voltage Vthn of transistor 7 gets higher. Thus, the verifying sense amplifier load current I2 also becomes smaller as threshold voltage Vthn of transistor 7 gets higher. FIG. 13 is a graph of the vicinity XII of the Vcc lower limit in FIG. 11 shown enlarged. In FIG. 13, memory cell currents Icell0 and verifying sense amplifier load currents I2 at a low threshold voltage LVthn, a standard threshold voltage MVthn, and a high threshold voltage HVthn are respectively shown. At the Vcc lower limit, memory cell current Icell0 and verifying sense amplifier load current I2 become smaller as threshold voltage Vthn gets higher. Consequently, sense amplifier 1 might determine that the programming is completed even when memory cell current Icell0 is small during the verify operation. Thus, read margin ΔIa at the Vcc lower limit becomes smaller as threshold voltage Vthn of transistor 7 becomes higher. In FIG. 13, the read margin at a low threshold voltage is denoted by ΔIa@LVthn, the read margin at a standard threshold voltage is denoted by ΔIa@MVthn, and the read margin at a high threshold voltage is denoted by ΔIa@HVthn. Threshold voltage Vthn of transistor 7 varies according to process variation. As a result, read margin ΔIa at the Vcc lower limit varies according to the process variation.

SUMMARY OF THE INVENTION

The object of the present invention is to provide a non-volatile semiconductor memory device provided with a sense amplifier having a stable read margin that is independent of the temperature fluctuation and the process variation.

According to one aspect of the present invention, a non-volatile semiconductor memory device is provided with a non-volatile memory cell, a constant-current source, and a sense amplifier. The constant-current source generates a constant current. The sense amplifier detects the threshold voltage of the non-volatile memory cell. The sense amplifier includes a load current supplying circuit and a comparing circuit. The load current supplying circuit supplies a load current according to the constant current during a read operation and a verify operation. The comparing circuit compares a memory cell current that flows through the non-volatile memory cell with the load current.

In the above-described non-volatile semiconductor memory device, a sense amplifier is used for both the purposes of reading and verifying so that the characteristics of the sense amplifier and the characteristics of the non-volatile memory cell can be readily matched, while the layout area required for the sense amplifier can be reduced.

Preferably, the constant current has the positive temperature characteristic.

As a result, the load current also has the positive temperature characteristic. On the other hand, the memory cell current has the positive temperature characteristic at the lower limit of the power-supply voltage so that the read margin does not get smaller at low temperatures, and a stable read margin not dependent on the temperature can be ensured.

The constant-current source preferably is a bandgap reference circuit.

Thus, a constant current is generated according to a diffusion potential (also referred to as a built-in potential) of a PN junction. Therefore, a stable load current can be supplied even with process variations.

According to another aspect of the present invention, the non-volatile semiconductor memory device is provided with a non-volatile memory cell, a constant-current generating circuit for generating a constant current, and a sense amplifier. The sense amplifier includes a first load current supplying circuit, a second load current supplying circuit, a switch, and a comparing circuit. The first load current supplying circuit supplies a first load current that remains constant against the temperature fluctuation according to the constant current during the verify operation. The second load current supplying circuit supplies a second load current according to the constant current during the read operation. The switch selects the first load current during the verify operation, and selects the second load current during the read operation. The comparing circuit compares the memory cell current that flows through the non-volatile memory cell with the load current selected by the switch.

In the above-described non-volatile semiconductor memory device, the verifying load current remains constant against the temperature fluctuation so that an accurate verify operation can be performed.

Preferably, the constant-current generating circuit includes a first constant-current source and a second constant-current source. The first constant-current source generates a first constant current having the positive temperature characteristic. The second constant-current source generates a second constant current having the negative temperature characteristic. The first load current supplying circuit includes a first transistor and a second transistor. The first transistor supplies to a switch a first current proportional to the first constant current. The second transistor supplies to the switch a second current proportional to the second constant current along with the first current.

Thus, the first current has the positive temperature characteristic, while the second current has the negative temperature characteristic. Since the first and second currents are combined, the first load current has no temperature characteristic.

Preferably, the second load current supplying circuit includes a transistor for supplying to a switch a second load current proportional to the first constant current.

Thus, the second load current has the positive temperature characteristic. Consequently, a stable read margin independent of the temperatures can be ensured at the lower limit of the power-supply voltage.

More preferably, second load current supplying circuit further includes a resistor connected to a power supply and connected in parallel to a third transistor.

Thus, a current that is dependent on the power-supply voltage flows through the resistor. Consequently, the second load current has a power-supply voltage dependency as well as the temperature dependency so that the read margins at the upper limit and the lower limit of the power-supply voltage can be further increased.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will be described in detail below with reference to the drawings. Moreover, the same or corresponding parts are denoted by the same reference characters throughout the drawings, and the descriptions thereof will not be repeated.

First Embodiment

Figure 1:
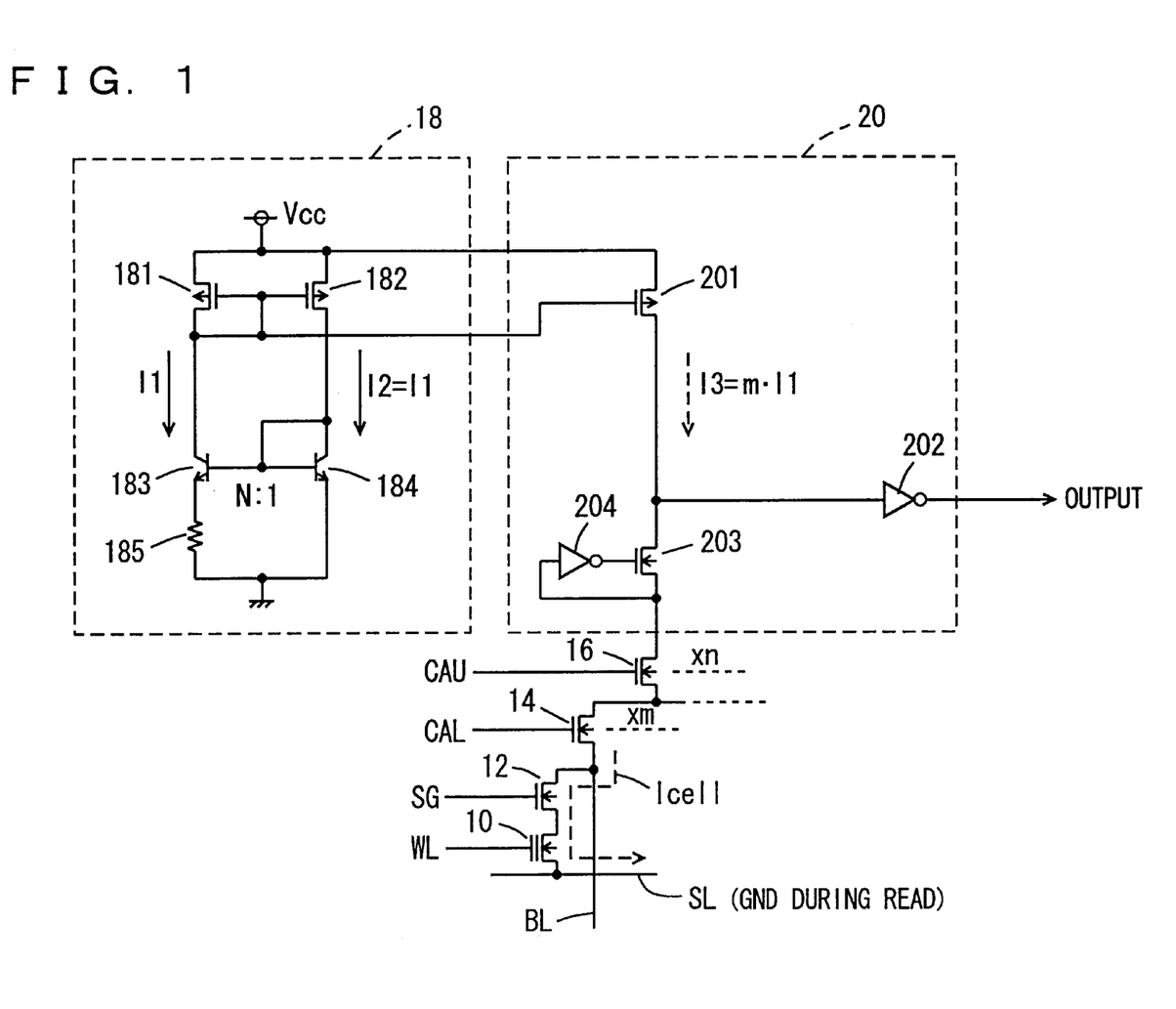
FIG. 1 is a circuit diagram representing the arrangement of a main portion of a flash memory according to a first embodiment of the present invention.

FIG. 1 is a circuit diagram representing the arrangement of a main portion of a DINOR-type flash memory according to the first embodiment of the present invention. As shown in FIG. 1, the flash memory is provided with a non-volatile memory cell 10 formed by a floating gate N-channel MOS transistor, a word line WL connected to a gate of non-volatile memory cell 10, a source line SL connected to a source of non-volatile memory cell 10, a bit line BL intersecting word line WL, a select gate 12 for selecting non-volatile memory cell 10, Y gates 14 and 16 for selecting bit line BL, a constant-current source 18 for generating a constant current I1 (=I2), and a sense amplifier 20 for detecting a threshold voltage of non-volatile memory cell 10.

The threshold voltage of non-volatile memory cell 10 becomes low in the programmed state, and becomes high in the erased state. Here, the programmed state where the threshold voltage is low is defined as "0" and the erased state where the threshold voltage is high is defined as "1."

Select gate 12 is formed by an N-channel MOS transistor, and is turned on in response to an H level memory cell selecting signal SG. The lower Y gate 14 is formed by an N-channel MOS transistor, and is turned on in response to an H level lower column selecting signal CAL. A plurality of lower Y gates 14 (xm in number) are provided in a line. An upper Y gate 16 is formed by an N-channel MOS transistor, and is turned on in response to an H level upper column selecting signal CAU. A plurality of upper Y gates 16 (xn in number) are provided in a line. When the voltage of word line WL rises, a memory cell current Icell corresponding to the threshold voltage flows through non-volatile memory cell 10.

Constant-current source 18 includes P-channel MOS transistors 181 and 182, NPN transistors 183 and 184 and a resistor 185. P-channel MOS transistors 181 and 182 form a current mirror circuit. NPN transistors 183 and 184 also form a current mirror circuit. Thus, a current I2 that flows through transistors 182 and 184 becomes equal to a current I1 that flows through transistors 181 and 183. Constant-current source 18 is a bandgap reference circuit for generating a constant current I1 with a diffusion potential (built-in potential) in a PN junction of NPN transistors 183 and 184 serving as a reference. Constant current I1 is given by the following equation (1):

$$I1 = \frac{1}{R1} \cdot \frac{kT}{q} \cdot \ln(N) \tag{1}$$

In equation (1), R1 is a resistance value of resistor 185, k is Boltzmann's constant, T is an absolute temperature, q is the Coulomb charge, and N is the ratio of the size of transistor 183 to the size of transistor 184.

Sense amplifier 20 includes a P-channel MOS transistor 201, an inverter 202, an N-channel MOS transistor 203, and an inverter 204.

P-channel MOS transistor 201 and P-channel MOS transistor 181 together form a current mirror circuit. Thus, transistor 201 supplies a sense amplifier load current I3 proportional to constant current I1. Here, if the mirror coefficient of transistor 201 is m, in other words, if the size of transistor 201 is m times the size of transistor 181, sense amplifier load current I3 can be derived from the following equation (2):

$$\begin{aligned} I3 &= m \cdot I1 \\ &= m \cdot \frac{1}{R1} \cdot \frac{kT}{q} \cdot \ln(N) \end{aligned} \tag{2}$$

Inverter 202 compares memory cell current Icell with sense amplifier load current I3, and outputs an H level signal when memory cell current Icell is greater than sense amplifier load current I3 and an L level signal when memory cell current Icell is smaller than sense amplifier load current I3.

Inverter 204 and transistor 203 keep the drain voltage of memory cell 10 constant by feedback control.

Now, the operation of a flash memory thus configured will be described below.

Figure 2:
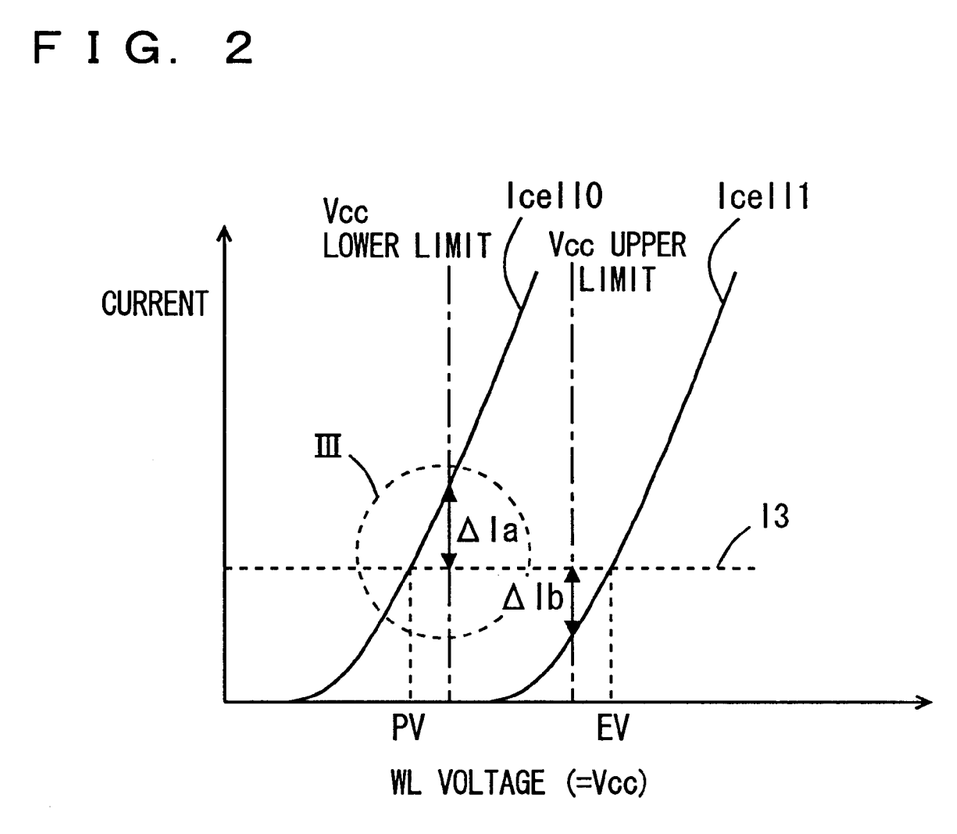
FIG. 2 is a graph showing the relations of a voltage of a word line with a sense amplifier load current and a memory cell current in the flash memory shown in FIG. 1.

FIG. 2 is a graph showing the relations of the voltage of word line WL with memory cell current Icell and sense amplifier load current I3.

(1) Program Operation

When programming memory cell 10, high voltage pulses are applied between word line WL and a drain of memory cell 10. More specifically, it is verified if the threshold voltage of memory cell 10 has become lower than a program verify voltage PV, and high voltage pulses are continually applied until the threshold voltage of memory cell 10 becomes lower than program verify voltage PV. If the threshold voltage of memory cell 10 has not become lower than program verify voltage PV, memory cell current Icell that flows through memory cell 10 is smaller than sense amplifier load current I3. Inverter 202 compares this memory cell current Icell with sense amplifier load current I3, and outputs an H level signal when memory cell current Icell is greater than sense amplifier load current I3, and an L level signal when memory cell current Icell is smaller than sense amplifier load current I3. As a result, sense amplifier 20 determines whether the threshold voltage of memory cell 10 has become lower than program verify voltage PV. The program operation is complete when the threshold voltage of memory cell 10 reaches program verify voltage PV.

(2) Erase Operation

When erasing memory cell 10, high voltage pulses that is reverse of those during programming are applied between a word line WL and a well including memory cell 10 and a source line SL. More specifically, high voltage pulses are applied continually until the threshold voltage of memory cell 10 becomes higher than erase verify voltage EV. In order to verify whether memory cell 10 has been erased or not, erase verify voltage EV is applied to word line WL. If the threshold voltage of memory cell 10 has not become higher than erase verify voltage EV, memory cell current Icell is greater than sense amplifier load current I3. The erase operation is complete when the threshold voltage of memory cell 10 reaches erase verify voltage EV.

(3) Read Operation

When reading memory cell 10, a voltage substantially equal to power-supply voltage Vcc is applied to a word line WL. Since power-supply voltage Vcc fluctuates, the voltage of word line WL also fluctuates. FIG. 2 shows the upper limit and the lower limit of power-supply voltage Vcc.

In memory cell 10 in the programmed state that is storing data of "0," a memory cell current Icell0 flows through memory cell 10 when the voltage substantially equal to power-supply voltage Vcc is applied to a word line WL. Since memory cell current Icell0 is greater than sense amplifier load current I3, sense amplifier 20 outputs an H level signal.

In memory cell 10 in the erased state that is storing data of "1," a memory cell current Icell1 flows through memory cell 10 when the voltage substantially equal to power-supply voltage Vcc is applied to a word line WL. Since memory cell current Icell1 is smaller than sense amplifier load current I3, sense amplifier 20 outputs an L level signal.

As shown in FIG. 1, the flash memory according to the first embodiment differs from the conventional flash memory shown in FIG. 10 in that, in the former, a common transistor 201 supplies a sense amplifier load current I3 proportional to a constant current I1 for the normal read operation and the verify operation.

Moreover, constant-current source 18 is a bandgap reference circuit so that constant current I1 generated by constant-current source 18 has the positive temperature characteristic as shown by the above equation (1). In addition, constant current I1 is not dependent on the threshold voltages of transistors 181 and 182, and is also stable in relation to process variations.

Figure 3:
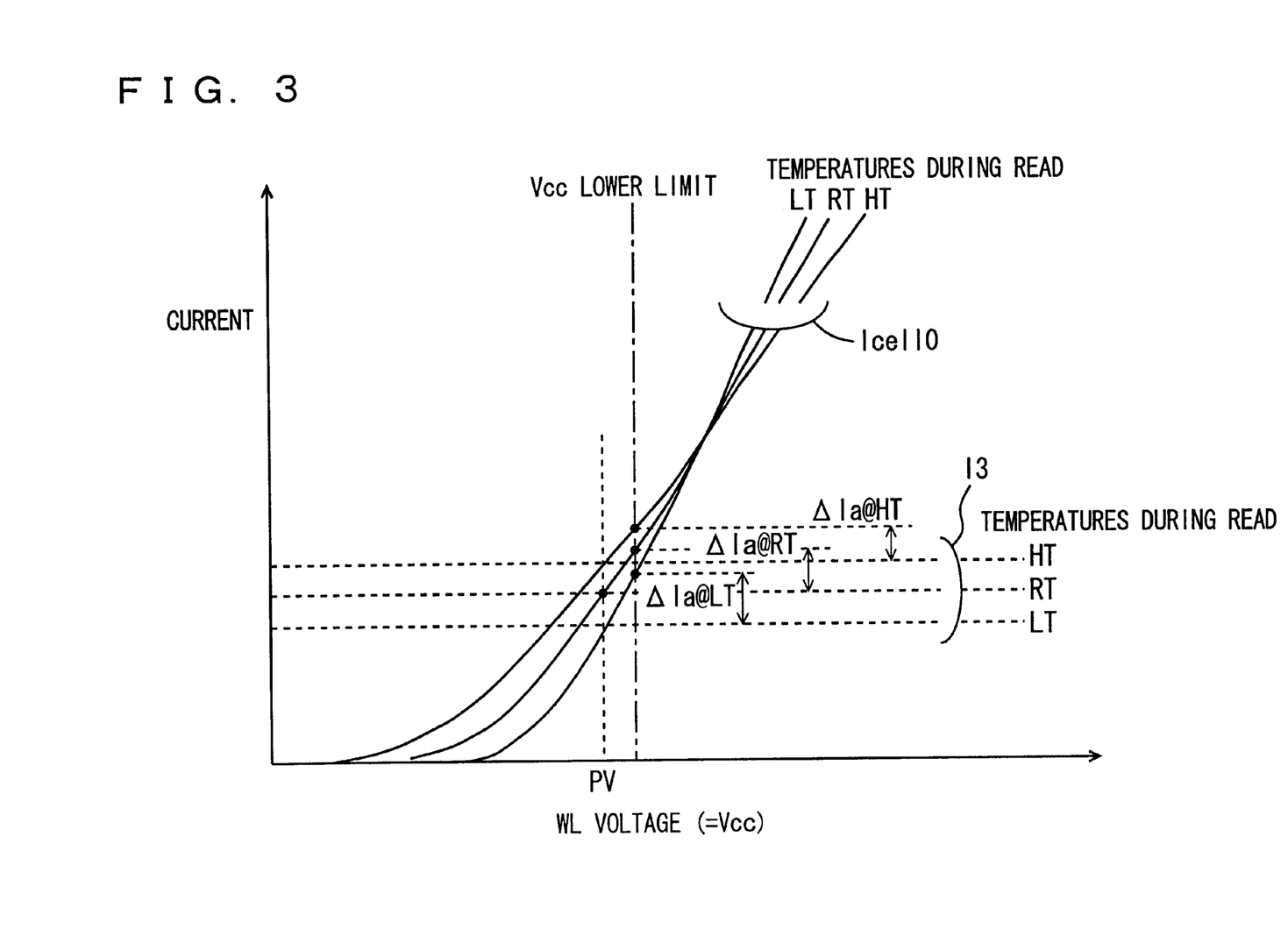
FIG. 3 is a graph of a vicinity III of the Vcc lower limit in FIG. 2 shown enlarged.

FIG. 3 is a graph of vicinity III of the Vcc lower limit in FIG. 2 shown being enlarged. As shown in FIG. 3, memory cell current Icell0 that flows through memory cell 10 in the programmed state during the normal read operation and during the verify operation has the positive temperature characteristic at the Vcc lower limit. Thus, memory cell current Icell0 at the Vcc lower limit becomes smaller as the temperature gets lower. On the other hand, since sense amplifier load current I3 is proportional to constant current I1, it has the positive temperature characteristic like memory cell current Icell0. Thus, sense amplifier load current I3 also becomes smaller as the temperature gets lower. Consequently, the temperature characteristics of memory cell current Icell0 and sense amplifier load current I3 at the Vcc lower limit are cancelled out, and the temperature dependency of a read margin ΔIa at the Vcc lower limit becomes small. FIG. 3 shows a Vcc lower limit read margin ΔIa@LT at a low temperature LT, a Vcc lower limit read margin ΔIa@RT at room temperature RT, and a Vcc lower limit read margin ΔIa@HT at a high temperature HT, respectively. These read margins become substantially the same.

As described above, according to the first embodiment, sense amplifier 20 is used for both the purposes of normal read and of verify-read so that the characteristics of sense amplifier 20 and the characteristics of memory cell 10 can be readily matched, and further, the layout area required for sense amplifier 20 can be reduced. In addition, since sense amplifier load current I3 has the positive temperature characteristic, sufficient read margin ΔIa can be ensured at the Vcc lower limit. Furthermore, since constant-current source 18 is formed by a bandgap reference circuit, constant current I1 is generated with a diffusion potential of a PN junction serving as a reference. Thus, sense amplifier load current I3 is stable even when the process varies, and read margin ΔIa can be made large at the Vcc lower limit.

Second Embodiment

In the above-described first embodiment, the same transistor 201 supplies sense amplifier load current I3 during the normal read operation and during the verify operation and this sense amplifier load current I3 has a positive temperature characteristic so that the following problems occur.

When performing a program verify (i. e., verifying whether memory cell 10 attained the programmed state or not) at a low temperature, it is determined that a "program pass" has occurred (i. e., memory cell 10 has attained the programmed state) even with small memory cell current Icell0 so that the read margin at the Vcc lower limit during the subsequent normal read operation becomes small. Thus, when performing a program verify at a low temperature LT as shown in FIG. 3, it is determined whether the threshold voltage of memory cell 10 has reached program verify voltage PV. For this purpose, sense amplifier 20 compares memory cell current Icell0 at low temperature LT with sense amplifier load current I3 at low temperature LT. When memory cell current Icell0 at low temperature LT reaches sense amplifier load current I3 at low temperature LT, it is determined to be a program pass.

Moreover, when performing an erase verify (i. e., verifying whether memory cell 10 attained the erased state or not) at a high temperature, it is determined that a "erase pass" has occurred (i. e., memory cell 10 has attained the erased state) even with large memory cell current Icell1 so that the read margin at the Vcc upper limit during the subsequent normal read operation becomes small.

The second embodiment is made to solve such problems, and is intended to match optimally the sense amplifier characteristic and the memory cell characteristic and to ensure an even more sufficient read margin.

Figure 4:
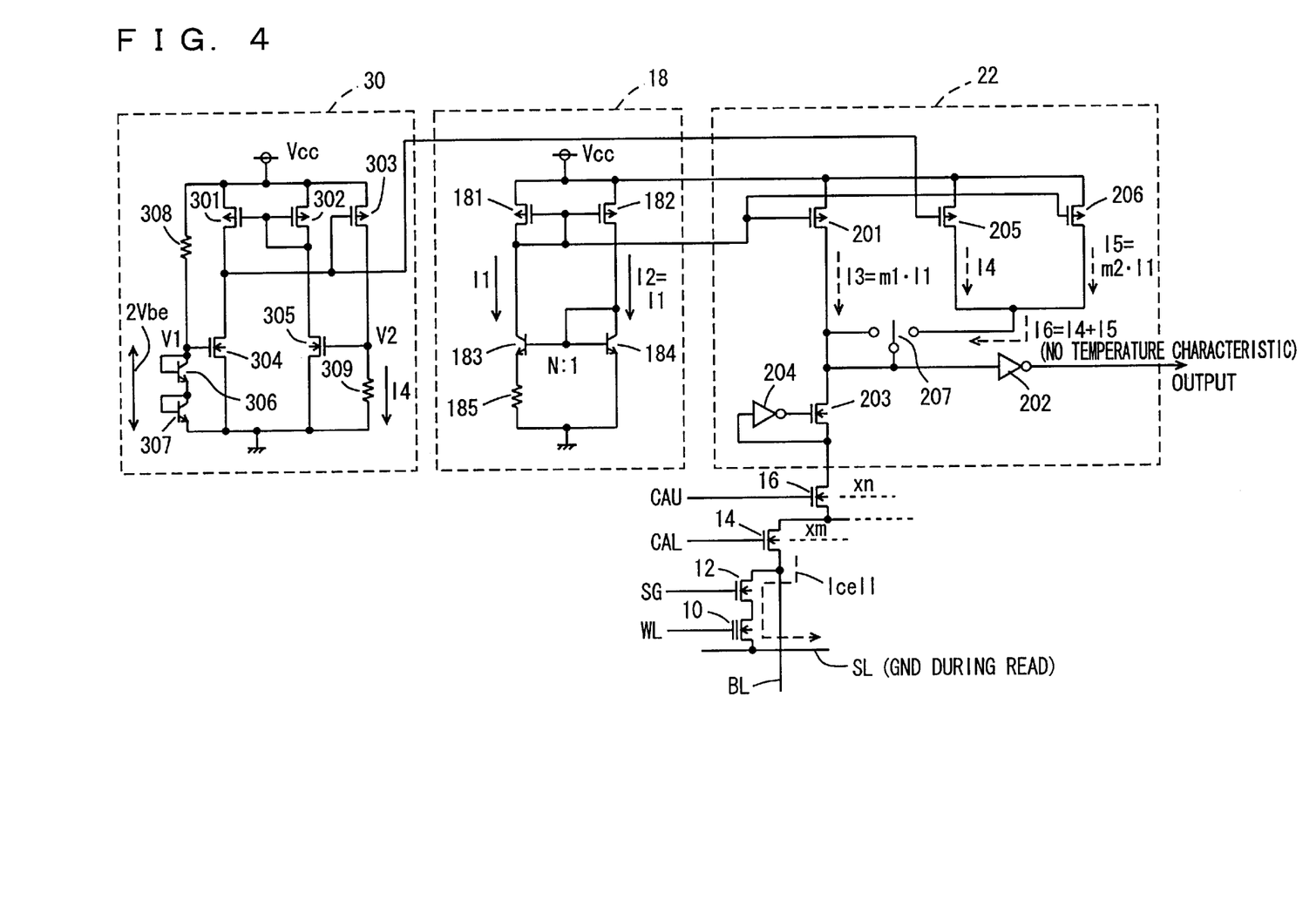
FIG. 4 is a circuit diagram representing the arrangement of a main portion of a flash memory according to a second embodiment of the present invention.

FIG. 4 is a circuit diagram representing the arrangement of a main portion of a flash memory according to the second embodiment of the present invention. In the second embodiment shown in FIG. 4, unlike the first embodiment shown in FIG. 1, a sense amplifier 22 is provided with P-channel MOS transistors 205 and 206 for supplying a verifying sense amplifier load current I6 besides P-channel MOS transistor 201 for supplying a normal-read sense amplifier load current I3. Sense amplifier 22 is further provided with a switch 207 for selecting transistor 201 during a normal read operation and for selecting transistors 205 and 206 during the verify operation.

The flash memory is further provided with a constant-current source 18 for generating a constant current I1 and a constant-current source 30 for generating a constant current I4. Constant-current source 18 is identical to that of the above first embodiment. As described above, constant current I1 has the positive temperature characteristic, while constant current I4 has the negative temperature characteristic.

Constant-current source 30 includes P-channel MOS transistors 301 to 303, N-channel MOS transistors 304 and 305, NPN transistors 306 and 307, and resistors 308 and 309. Transistors 301, 302, 304, and 305 form a current mirror type differential amplifier, which drives transistor 303 such that a gate voltage V2 of transistor 305 becomes equal to a gate voltage V1 of transistor 304.

Here, assuming that the diffusion voltage of transistors 306 and 307 is Vbe, voltage VI is given by the following equation (3):

$$V1 = 2Vbe \quad (3)$$

Therefore, assuming that the resistance value of resistor 309 is R2, constant current I4 can be provided by the following equation (4):

$$I4 = \frac{V2}{R2} = \frac{2Vbe}{R2} \quad (4)$$

Transistor 201 of sense amplifier 22 and a transistor 181 of constant-current source 18 together form a current mirror circuit. If the ratio of the size of transistor 181 to the size of transistor 201, or the mirror coefficient, is m1, normal-read sense amplifier load current I3 supplied by transistor 201 is given by the following equation (5):

$$I3 = m1 \cdot I1 \quad (5)$$
$$= m1 \cdot \frac{1}{R1} \cdot \frac{kT}{q} \cdot \ln(N)$$

In addition, if the ratio of the size of transistor 205 to the size of transistor 303, or the mirror coefficient, is 1, transistor 205 supplies a current I4 that is equal to current I4 that flows through transistor 303.

Further, transistor 206 of sense amplifier 22 and transistor 181 of constant-current source 18 together form a current mirror circuit. If the ratio of the size of transistor 181 to the size of transistor 206, or the mirror coefficient, is m2, transistor 206 supplies a current I5 (=m2·I1) proportional to constant current I1.

Verifying sense amplifier load current I6 is a combination of current I4 and current I5 so that it is derived by the following equation (6):

$$I6 = I4 + I5 \quad (6)$$
$$= I4 + m2 \cdot I1$$
$$= \frac{2Vbe}{R2} + m2 \cdot \frac{1}{R1} \cdot \frac{kT}{q} \cdot \ln(N)$$

Diffusion voltage Vbe generally has the negative temperature characteristic so that current I4 also has the negative temperature characteristic. On the contrary, current I5 has the positive temperature characteristic. Consequently, the temperature characteristic of current I4 and the temperature characteristic of current I5 are cancelled out, and thus, verifying sense amplifier load current I6 has no temperature dependency. As a result, an accurate verify operation can be performed even with temperature fluctuations.

Figure 5:
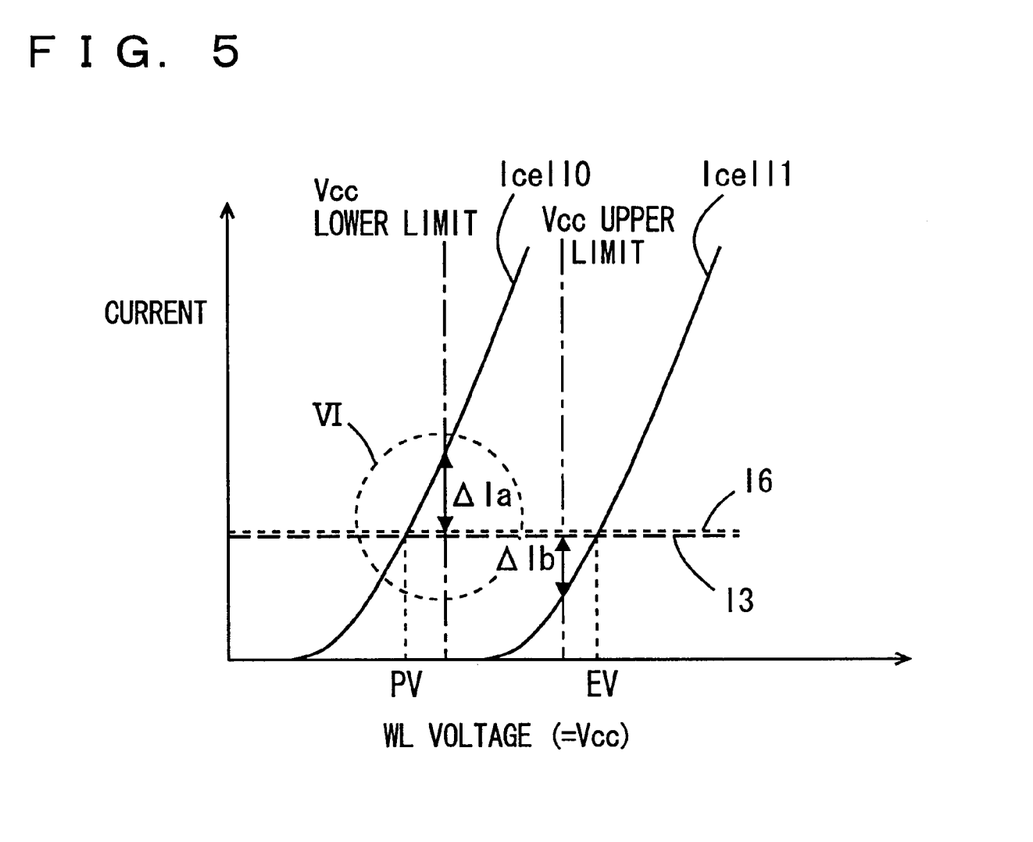
FIG. 5 is a graph showing the relations of a voltage of a word line with a sense amplifier load current and a memory cell current in the flash memory shown in FIG. 4.
Figure 6:
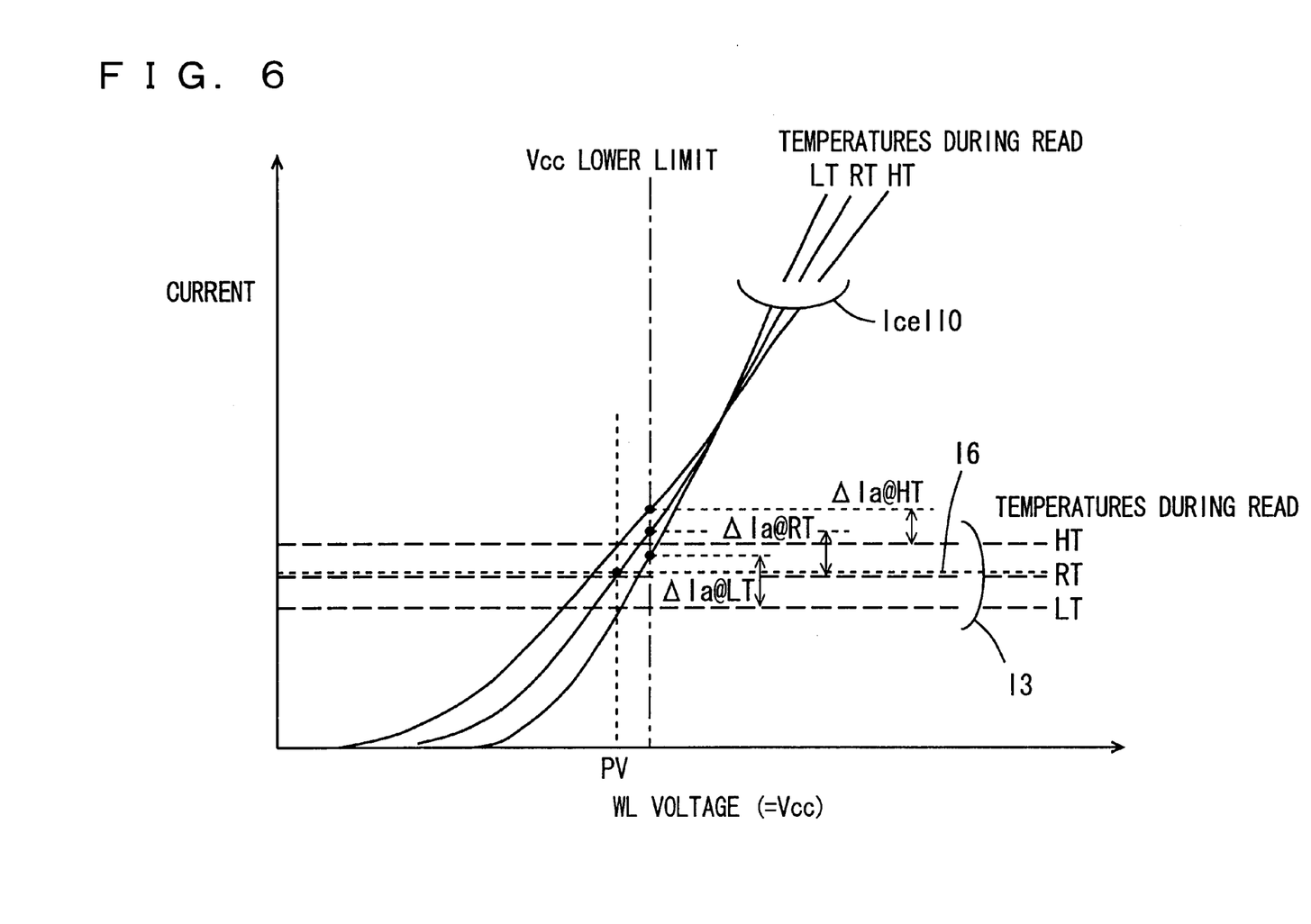
FIG. 6 is a graph of a vicinity VI of the Vcc lower limit in FIG. 5 shown enlarged.

As shown in FIG. 5, sense amplifier load currents I3 and I6 do not have power-supply voltage Vcc dependency. Moreover, as shown in FIG. 6, while normal-read sense amplifier load current I3 has temperature dependency, verifying sense amplifier load current I6 does not.

As seen from the above, according to the second embodiment, verifying sense amplifier load current I6 does not have a temperature characteristic so that the characteristic of sense amplifier 22 and the characteristic of memory cell 10 can be optimally matched.

Third Embodiment

Figure 7:
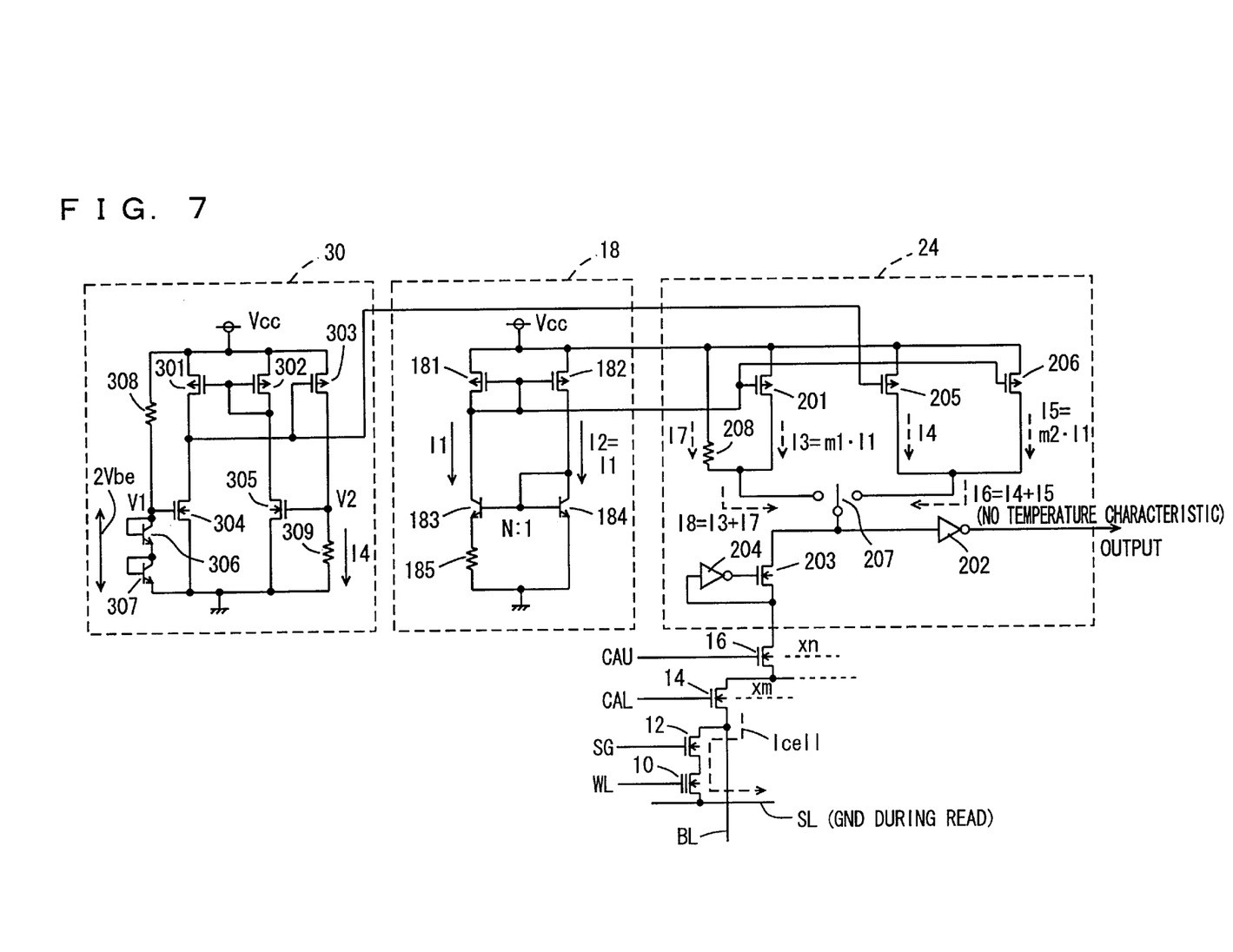
FIG. 7 is a circuit diagram representing the arrangement of a main portion of a flash memory according to a third embodiment of the present invention.

FIG. 7 is a circuit diagram representing the arrangement of a main portion of a flash memory according to the third embodiment of the present invention. A sense amplifier 24 of the flash memory shown in FIG. 7, unlike the second embodiment shown in FIG. 4, a resistor 208 is connected in parallel to transistor 201. Here, transistor 201 and resistor 208 supply a normal-read sense amplifier load current I8. Sense amplifier load current I8 is current I3 flowing through transistor 201 and a current I7 flowing through resistor 208 combined. Current I3 has the positive temperature characteristic as described above. Current I7 is proportional to power-supply voltage Vcc. If the proportional coefficient is a and the resistance value of resistor 208 is R3, normal-read sense amplifier load current I8 is derived by the following equation (7):

$$I8 = I3 + I7 \quad (7)$$
$$= m1 \cdot I1 + I7$$
$$= m1 \cdot \frac{1}{R1} \cdot \frac{kT}{q} \cdot \ln(N) + \alpha \frac{1}{R3}$$

Figure 8:
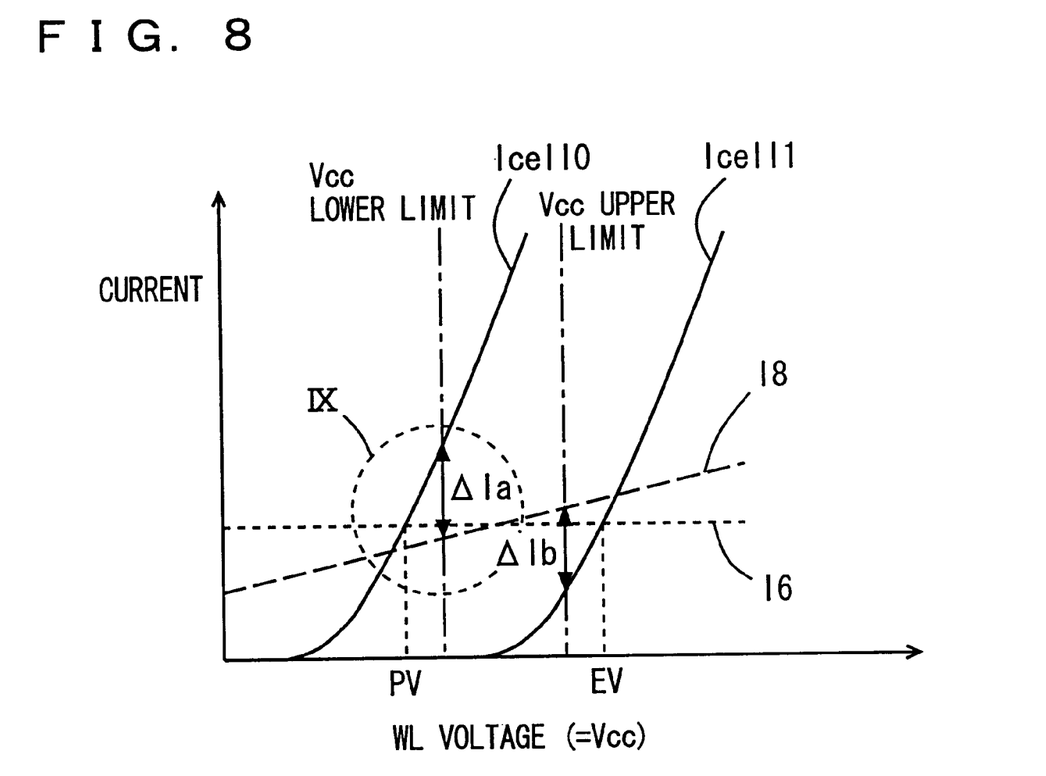
FIG. 8 is a graph showing the relations of a voltage of a word line with a sense amplifier load current and a memory cell current in the flash memory shown in FIG. 7.

As shown in FIG. 8, normal-read sense amplifier load current I8 becomes larger in proportion to power-supply voltage Vcc (voltage of word line WL). Thus, both read margin ΔIa at the Vcc lower limit and read margin ΔIb at the Vcc upper limit become larger than those in the above-described first and second embodiments.

Figure 9:
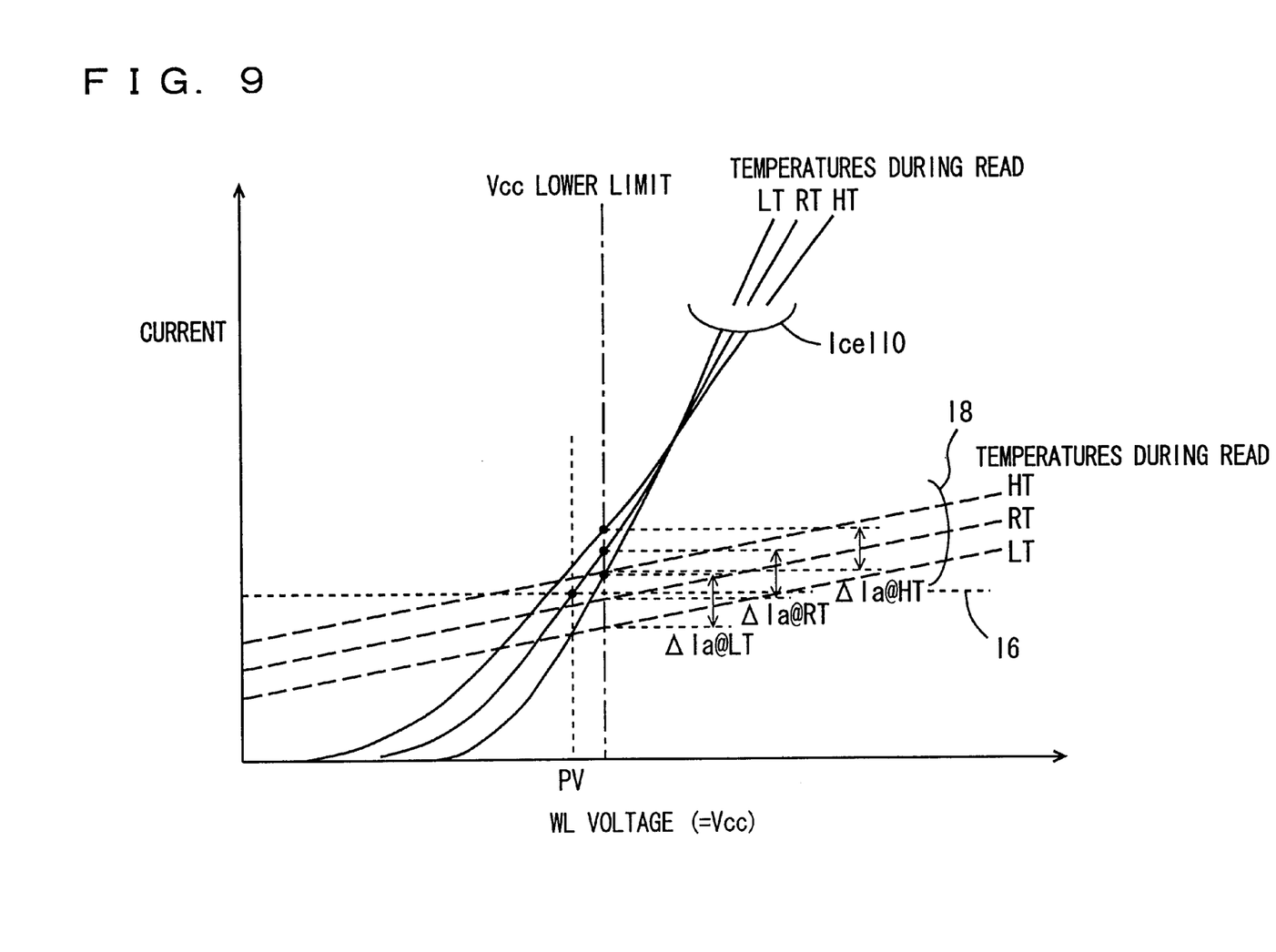
FIG. 9 is a graph of a vicinity IX of the Vcc lower limit in FIG. 8 shown enlarged.

Moreover, as shown in FIG. 9, normal-read sense amplifier load current I8 has the positive temperature characteristic. Consequently, the temperature dependency of read margin ΔIa at the Vcc lower limit becomes small, as in the first and second embodiments above.

Thus, according to the third embodiment, resistor 208 connected to a power supply Vcc is additionally provided so that normal-read sense amplifier load current I8 not only has the positive temperature characteristic but also has the power-supply voltage Vcc dependency. As a result, both read margin ΔIa at the Vcc lower limit and read margin ΔIb at the Vcc upper limit become larger than those in the above-described first and second embodiments.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device, comprising:

a non-volatile memory cell;

a constant-current source generating a constant current; and a sense amplifier detecting a threshold voltage of said non-volatile memory cell, said sense amplifier including a load current supplying circuit supplying a load current according to said constant current during a read operation and a verify operation, and a comparing circuit comparing a memory cell current that flows through said non-volatile memory cell with said load current.

2. The non-volatile semiconductor memory device according to claim 1, wherein said constant current has positive temperature characteristic.

3. The non-volatile semiconductor memory device according to claim 1, wherein said constant-current source is a band gap reference circuit.

4. The non-volatile semiconductor memory device according to claim 1, wherein said load current supplying circuit includes a transistor for supplying said load current proportional to said constant current.

5. A non-volatile semiconductor memory device, comprising:

a non-volatile memory cell;

a constant-current generating circuit generating a constant current; and a sense amplifier detecting a threshold voltage of said non-volatile memory cell, said sense amplifier including a first load current supplying circuit supplying a first load current that is constant relative to temperature fluctuation according to said constant current during a verify operation, a second load current supplying circuit supplying a second load current according to said constant current during a read operation, a switch selecting said first load current during said verify operation and selecting said second load current during said read operation, and a comparing circuit for comparing a memory cell current that flows through said non-volatile memory cell with a load current selected by said switch.

6. The non-volatile semiconductor memory device according to claim 5, wherein said constant-current generating circuit includes a first constant-current source generating a first constant current having positive temperature characteristic, and a second constant-current source generating a second constant current having negative temperature characteristic, wherein said first load current supplying circuit includes a first transistor for supplying to said switch a first current proportional to said first constant current, and a second transistor for supplying to said switch a second current proportional to said second constant current along with said first current.

7. The non-volatile semiconductor memory device according to claim 6, wherein said second load current supplying circuit includes a third transistor for supplying to said switch said second load current proportional to said first constant current.

8. The non-volatile semiconductor memory device according to claim 7, wherein said second load current supplying circuit further includes a resistor connected to a power supply and connected in parallel to said third transistor.

* * * * *